(12) United States Patent
Mollier

(10) Patent No.: US 10,684,315 B2
(45) Date of Patent: Jun. 16, 2020

(54) SYSTEM FOR INDICATING THE PRESENCE OF VOLTAGE IN A HIGH-VOLTAGE NETWORK

(71) Applicant: SCHNEIDER ELECTRIC INDUSTRIES SAS, Rueil Malmaison (FR)

(72) Inventor: Christophe Mollier, Chamoz sur Ain (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 33 days.

(21) Appl. No.: 16/132,670

(22) Filed: Sep. 17, 2018

(65) Prior Publication Data

US 2019/0101574 A1 Apr. 4, 2019

(30) Foreign Application Priority Data

Sep. 29, 2017 (FR) ...................................... 17 71034

(51) Int. Cl.
*G01R 19/155* (2006.01)
*G01R 19/25* (2006.01)
(Continued)

(52) U.S. Cl.
CPC ........... *G01R 19/155* (2013.01); *G01R 15/16* (2013.01); *G01R 19/1658* (2013.01);
(Continued)

(58) Field of Classification Search
CPC .................. G01R 19/155; G01R 15/16; G01R 19/16523; G01R 19/1658; G01R 19/2513; G01R 25/00; G01R 25/005
(Continued)

(56) References Cited

U.S. PATENT DOCUMENTS 10,126,335 B2* 11/2018 Bolouri-Saransar ... G01R 15/12
10,228,406 B2* 3/2019 Verneau ................. G01R 23/15
(Continued)

FOREIGN PATENT DOCUMENTS

CN 203759137 U 8/2014
DE 4133936 A1 * 4/1993 ............. G01R 15/16
(Continued)

OTHER PUBLICATIONS

Schneider Electric. Easergy VPIS V2, Easergy Range Voltage Presence Indicating System for Medium Voltage cubicles (Year: 2019).*
(Continued)

*Primary Examiner* — Patrick Assouad
*Assistant Examiner* — Sean Curtis
(74) *Attorney, Agent, or Firm* — Oblon, McClelland, Maier & Neustadt, L.L.P.

(57) ABSTRACT

A voltage presence indicating system intended to be connected to a voltage measurement sensor for each phase of a high-voltage electrical network, a visual indicator representing the presence of the measured voltage, a first peak limiter having a first regulation voltage so as to deliver a first sinusoidal output signal representing the measured voltage and a second peak limiter having a second regulation voltage so as to deliver a second sinusoidal output signal representing the phase angle of the measured voltage, the second regulation voltage being higher than the first regulation voltage.

9 Claims, 1 Drawing Sheet

(51) Int. Cl.
*G01R 25/00* (2006.01)
*G01R 15/16* (2006.01)
*G01R 19/165* (2006.01)

(52) U.S. Cl.
CPC ... *G01R 19/16523* (2013.01); *G01R 19/2513* (2013.01); *G01R 25/00* (2013.01); *G01R 25/005* (2013.01)

(58) Field of Classification Search
USPC ...................................... 324/76.77, 76.82, 86
See application file for complete search history.

(56) References Cited

U.S. PATENT DOCUMENTS

| | | | | |
|---|---|---|---|---|
| 2017/0269129 A1* | 9/2017 | Bolouri-Saransar | ... | G01R 15/12 |
| 2019/0101574 A1* | 4/2019 | Mollier | ................ | G01R 25/005 |

FOREIGN PATENT DOCUMENTS

| | | | | | |
|---|---|---|---|---|---|
| DE | 19751654 | A1 | * | 5/1999 | ........... G01R 19/155 |
| DE | 101 62 822 | A1 | | 6/2003 | |
| DE | 20 2013 002 563 | U1 | | 3/2013 | |
| EP | 0635725 | A2 | * | 1/1995 | ............. G01R 15/22 |
| EP | 2538229 | A1 | * | 12/2012 | ............. G01R 25/00 |
| EP | 3361268 | A1 | * | 8/2018 | ........... G01R 19/155 |
| EP | 3462187 | A1 | * | 4/2019 | ............. G01R 15/16 |
| FR | 3071927 | A1 | * | 4/2019 | ........... G01R 19/155 |
| FR | 3071927 | B1 | * | 9/2019 | ........... G01R 25/005 |
| WO | WO-2011000754 | A1 | * | 1/2011 | ......... G01R 19/2513 |

OTHER PUBLICATIONS

Schneider Electric. Easergy VPIS V3, Easergy Range Voltage Presence Indicating System for Medium Voltage cubicles (Year: 2019).*

French Preliminary Search Report dated Jun. 4, 2018 in French Application 17 71034 filed on Sep. 29, 2017 (with English Translation of Categories of cited documents & Written Opinion).

* cited by examiner

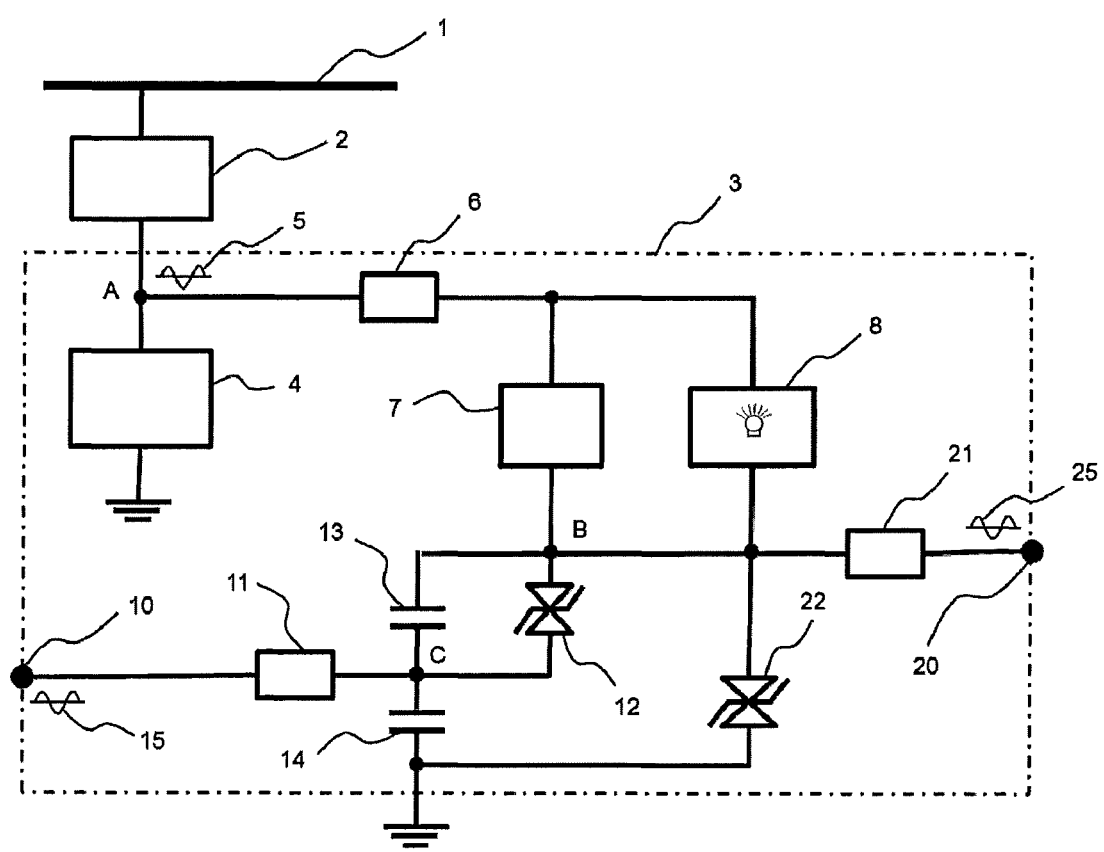

SYSTEM FOR INDICATING THE PRESENCE OF VOLTAGE IN A HIGH-VOLTAGE NETWORK

TECHNICAL FIELD OF THE INVENTION

The present invention concerns a voltage presence indicating system used to verify the presence or absence of voltage in the various phases of the electrical network of a switchgear cell and also used to verify the concordance of the phases between two switchgear cells with the aid of a phase comparator. A system of this kind is used in the control and surveillance of high-voltage electrical networks, that is to say with a voltage greater than 1000 V.

PRIOR ART

In high-voltage electrical networks, to be sure that a switchgear cell is live or not live, voltage sensors conforming to IEC standard 61243 are installed. These sensors are associated with electronic systems, usually called Voltage Presence Indicating Systems (VPIS), the operation of which is in particular defined in IEC standards 61958 and 62271. The term "VPIS system" is used in the remainder of the document.

There already exist voltage presence indicating systems intended to be connected to a voltage measurement sensor for each phase of an electrical network, as in the document DE10162822A1.

A VPIS system is directly connected to a voltage sensor connected to each phase of the multiphase electrical network. The voltage sensor is preferably of the bushing capacitor type, which also makes it possible to be able to self-power the VPIS system. A VPIS system, installed in a switchgear cell, is therefore capable of indicating, generally by visual means, the presence or absence of a voltage in the various phases of the electrical network of the switchgear cell.

Moreover, for each phase, a VPIS system provides an output signal that is usable in particular to verify the phase angle of the network voltage. It is therefore possible to connect this output signal to an external surveillance device, such as a phase comparator, to which the IEC standard 62271 also applies. Accordingly, to verify the direct correspondence between the phases of two switchgear cells of the same electric board, the two VPIS systems of the two cells are connected to a phase comparator. This makes it possible to verify the concordance of the phases between two cells, for example in order to verify the non-crossing of phases after connection of these cells during reconfiguration of the network or after any intervention following an incident. A phase comparator of this kind is capable of detecting phase discrepancies alone or in conjunction with frequency errors.

However, as indicated in the document EP3001206, in a modern VPIS system, the output signal intended for a phase comparator provides only the negative half-cycles of the measured voltage on one phase of the electrical network. In parallel with this, a modern VPIS system also provides another output signal making it possible to estimate the value of the measured phase voltage but provides only the positive half-cycles of the measured voltage on one phase of the electrical network. Sometimes complex digital processing is therefore required to reconstitute, using extrapolation and signal processing techniques, the missing half-cycle and to form a complete sinusoidal signal representing the measured voltage. Now, the result of such processing is not always satisfactory and remains somewhat inaccurate. Moreover, a VPIS system must remain simple and not consume too much energy.

It would therefore be desirable for a VPIS system, whilst remaining simple and economical, to be able using an electrical network phase voltage measuring sensor to carry out all of the following four functions, namely: protection against voltage surges, visual indication of the presence or absence of voltage, delivery of a sinusoidal output signal representing the measured voltage, and delivery of another sinusoidal output signal representing the phase angle of the measured voltage.

Moreover, in application of IEC standard 61958 and for safety reasons, if one of the last two above functions is deficient, because it is short-circuited for example, that must not affect the operation of the other functions of the VPIS system.

Accordingly, if for example the output delivering the signal representing the phase angle of the measured voltage is short-circuited, it is nevertheless necessary for the other output delivering the signal representing the measured voltage to remain functional, and vice versa.

STATEMENT OF INVENTION

The above aim is achieved by a voltage presence indicating system intended to be connected to a voltage measurement sensor for each phase of a high-voltage electrical network that includes for each phase: a visual indicator of the presence of a voltage measured by the sensor, a first peak limiter having a first regulation voltage so as to deliver, at a first output terminal, a first sinusoidal output signal representing the measured voltage, a second peak limiter having a second regulation voltage so as to deliver, at a second output terminal, a second sinusoidal output signal representing the phase angle of the measured voltage, the second regulation voltage being greater than the first regulation voltage.

According to one feature, the indicating system comprises for each phase a first limiter resistor connected to the first output terminal, and a second limiter resistor connected to the second output terminal, the second limiter resistor having a higher value than the first limiter resistor.

According to another feature, the indicating system comprises for each phase a capacitive bridge formed of a first capacitor in series with a second capacitor, the second peak limiter being connected in parallel with the capacitive bridge and the first peak limiter being connected in parallel with the first capacitor.

According to another feature, the indicating system comprises for each phase a device for adjusting a presence threshold for the measured voltage connected in parallel with the visual indicator. The presence threshold adjuster device includes a set of switchable resistors connected in parallel with one another.

According to another feature, the first peak limiter and the second peak limiter consist of two Zener diodes connected in opposite directions in series.

According to another feature, the indicating system also comprises for each phase a device for protection against transient voltage surges.

According to another feature, the visual indicator includes an LED that is powered intermittently when the measured voltage is greater than the presence threshold of the adjuster device.

The invention also concerns a phase comparison system, comprising first and second voltage presence indicating systems according to invention and a phase comparator, in which the phase comparator is connected to the second output terminals of the first and second voltage presence indicating systems of the same phase of the electrical network, so as to detect a phase angle difference between the second output signals of the first and second voltage presence indicating systems.

DETAILED DESCRIPTION

Other features will become apparent in the following detailed description given with reference to the appended FIG. 1 which shows the theoretical circuit diagram for one phase of one embodiment of a voltage indicating system according to the invention.

Referring to FIG. 1, a voltage presence indicating system, also termed a VPIS system, includes an electronic circuit 3 for each phase of a high-voltage electrical network, each electronic circuit 3 being able to include one or more printed circuits. The electronic circuit 3 receives at an input point A a sinusoidal signal 5 from a voltage measuring sensor 2, which may be a bushing capacitor. The voltage sensor 2 is connected to one phase 1 of the electrical network in order to supply the signal 5 that represents the measured voltage V of phase 1 relative to earth, at the level of the entry point A. VPIS systems are usually intended to be installed on the front panel of a high-voltage switchgear cell.

The VPIS system first implements a function of electrical protection against transient voltage surges. To this end, the electronic circuit 3 comprises an electrical protection module 4 that is connected between the entry point A and earth. The module 4 preferably comprises a gas-filled spark gap. The phase spark gap is used to protect goods and persons in the event of failure of the bushing capacitor 2.

The VPIS system then implements a function of visually indicating the presence of the voltage V measured by the sensor 2, which makes it possible to indicate easily the presence of a voltage on phase 1 to an operator located in front of the switchgear cell. To this end, the electronic circuit 3 comprises a visual indicator 8, which generally consists of an LED, and which is connected on one side to the entry point A via a resistor 6 for limiting the input current and on the other side to a middle point B of the electronic circuit 3.

This visual indicator 8 is lit if the measured voltage V overshoots a certain preconfigured firing threshold. That firing threshold is preferably adjustable because VPIS systems are intended to be installed in switchgear cells liable to be used for high-voltage electrical networks in different countries. Now the voltage levels vary from one country to another (for example 20 kV or 15 kV), some countries even having a plurality of distinct voltage levels. It is therefore important to provide an adjustable firing threshold of the visual voltage presence indicator.

This is why the VPIS system includes a threshold adjuster device 7 that is connected in parallel with the visual indicator 8. According to a preferred embodiment, this adjuster device 7 in fact includes a single resistor the value of which is chosen as a function of the required firing threshold. Alternatively, the adjuster device 7 could consist of a set of switchable resistors connected in parallel, for example nine resistors corresponding to nine threshold values, which would make it possible to modify the firing threshold more easily.

Another variant embodiment would consist in using a set of capacitors, but the choice of the resistors is guided by the wish to avoid harmonics. Another variant will consist in using a capacitor/resistor combination.

The LED of the visual indicator 8 is therefore either off when the measured voltage is below the firing threshold, or on when the measured voltage is greater than or equal to the firing threshold. Nevertheless, to optimize the consumption of current in the VPIS system and therefore to function with a minimum power supply current, the LED is not powered continuously, but only intermittently, using the phenomenon of retinal persistence to give the illusion of continuous firing.

The visual indicator 8 may also be used in combination to assist with the verification of the concordance of phases between two cells, when two VPIS systems of two different cells are used in conjunction with a phase comparator.

As seen in FIG. 1, the signal 5 circulates in the various functional blocks of the VPIS system via the input current limiter resistor 6. Apart from current limitation, this resistor 6 is also involved in EMC (electromagnetic compatibility) with regard to normative tests. Its value is also chosen as a function of the spark gap 4: the higher the voltage of the spark gap 4 rises, the more it is necessary to increase the value of the resistor 6. A value of 2.7 kOhms 5% at $\frac{1}{8}^{th}$ of a Watt is suitable for limiting the input current in a satisfactory fashion.

The VPIS system supplies for each phase a first sinusoidal output signal 15 that represents the measured voltage V, which means that the output signal 15 makes it possible to determine, subject to a scaling factor, the various parameters of the measured phase voltage, such as in particular the rms value, the maximum or peak value, the waveform, the fundamental frequency and the harmonic components. The aim is to connect to the VPIS system an external device that could use this signal 15 easily and directly for various qualimetry functions but also for calculations of power and energy of the electrical network. The first output signal 15 is available at a first output terminal 10 of the electronic circuit 3 of the VPIS system.

To this end, the electronic circuit 3 of the VPIS system includes a first peak limiter 12 having a first regulation voltage. It also includes a first limiter resistor 11 and a capacitive bridge, which is formed of a first capacitor 13 in series with a second capacitor 14. The central point of the capacitive bridge between the capacitors 13 and 14 is termed point C. The first limiter resistor is connected between the first output terminal 10 and the central point C of the capacitive bridge. The first peak limiter 12 is connected between the middle point B of the electronic circuit 3 and the central point C. The capacitive bridge 13, 14 is connected between the mid-point B and earth.

Finally, the VPIS system supplies for each phase a second sinusoidal output signal 25 that represents the phase angle of the measured voltage V. This second output signal is available at a second output terminal 20 of the electronic circuit 3 so that it can be used by an external device, such as a phase comparator connected to the output terminal 20. In fact, by connecting a phase comparator to two VPIS systems, an operator can easily monitor the concordance of the phase angles between two phases and two distinct switchgear cells, even in the event of unavailability of the first output signal 15.

To this end, the electronic circuit 3 of the VPIS system includes a second peak limiter 22 connected between the mid-point B and earth and having a second regulation voltage. The electronic circuit 3 also includes a second limiter resistor 21 that is connected between the second output terminal 20 and the mid-point B. The second regulation voltage serves to guarantee a potential at the level of the middle point B.

The second output signal 25 is a full-wave sinusoidal signal and is precise as to the angular phase of the measured voltage V, which makes it very easy to use in conjunction with a phase comparator. On the other hand, it does not need to be as accurate as the first output signal 15 concerning the other parameters of the measured voltage V.

Accordingly, in the situation of surveillance of a three-phase network, a VPIS system therefore includes three electronic circuits 3 connected to three voltage measuring sensors 2 and includes three first output terminals 10 and three second output terminals 20.

The value of the first limiter resistor 11 is preferably chosen as being the lowest possible to ensure the maximum current of the sinusoidal output signal 15, when the latter is used, that is to say when there is a charge connected to the first output terminal 10. In fact the maximum current arriving in the input limiter resistor 6 must go to the first output signal 15 to have the best possible signal 15.

The value of the second limiter resistor 21 is higher than that of the first limiter resistor 11. In fact, unlike the first limiter resistor 11, the value of the second limiter resistor 21 must be sufficiently high to divert only a minimum of current into the phase comparator. The second output signal 25 must in fact represent only the phase angle of the measured voltage V. Accordingly, preference must be given to the passage of the current of the first output signal 15 but it must nevertheless be sure that the current of the second output signal 25 is sufficient to power a phase comparator connected to the second output terminal 20.

The first peak limiter 12 and the second peak limiter 22 are preferably each composed of two Zener diodes connected in opposite directions in series, which makes it possible to have available a full-wave signal for the first and second output signals 15, 25. Alternatively bidirectional Transil diodes (transient-voltage-suppression diode (TVS)) could also be used.

According to the invention, the regulation voltage of the second peak limiter 22 is greater than the regulation voltage of the first peak limiter 12. This makes it possible to guarantee that if the first output signal 15 is used for measurements, almost all of the current flowing in the input limiter resistor 6 indeed leaves on the side of the first output signal 15. In the chosen embodiment, the regulation voltage of the second peak limiter 22 is equal to 47 V whereas that of the first limiter 12 is equal to 39 V.

In fact, when the first output signal 15 is used, the first peak limiter 12 then imposes its voltage drop between the points B and C, which is to say that the regulation of the Zener diodes of the first peak limiter 12 will be as low as 39 V in the chosen embodiment. The voltage at the level of the central point C of the capacitive bridge will then be less than or equal to the difference between the respective regulation voltages of the peak limiters 12, 13. This voltage at the point C is retained by the second capacitor 14 of the capacitive bridge and simultaneously by the first limiter resistor 11 and the impedance of the external apparatus that will be connected to the first output terminal 10 to exploit the first output signal 15.

As the limitation voltage of the first peak limiter 12 is less than that of the second peak limiter 22, this guarantees that if the first output signal 15 is used, the majority of the current is diverted on the measurement side, including if the second output signal 25 is also used (in which case the second peak limiter 25 will come to regulate the voltage at the mid-point B to 47 V in this example. Accordingly, the deviated current on the side of the second output signal 25 is very weak in comparison with that on the side of the output signal 15.

By choosing a regulation voltage of the first peak limiter 12 of 39 V, a regulation voltage of the 47 V second peak limiter 22, a value of 10 MOhms±1% $\frac{1}{8}^{th}$ Watt for the second limitation resistor 21 and a value of 1.1 kOhms at 1% $\frac{1}{8}^{th}$ Watt for the first limiter resistor 11, it is therefore certain that most of the current will indeed go toward the first output terminal 10 whilst guaranteeing that the current that will be diverted to the second output terminal 20 will be 4.7 µA maximum, which is an order of magnitude sufficient to power a phase comparator.

The invention claimed is:

1. A voltage presence indicating system intended to be connected to a voltage measurement sensor for each phase of a high-voltage electrical network, wherein the indicating system comprises for each phase:
   a visual indicator of the presence of a voltage measured by the sensor,
   a first peak limiter having a first regulation voltage so as to deliver, at a first output terminal, a first sinusoidal output signal representing the measured voltage,
   a second peak limiter having a second regulation voltage so as to deliver, at a second output terminal, a second sinusoidal output signal representing a phase angle of the measured voltage, the second regulation voltage being greater than the first regulation voltage.

2. The indicating system according to claim 1, wherein it includes for each phase a first limiter resistor connected to the first output terminal, and a second limiter resistor connected to the second output terminal, the second limiter resistor having a higher value than the first limiter resistor.

3. The indicating system according to claim 1, wherein it includes for each phase a capacitive bridge formed of a first capacitor in series with a second capacitor, the second peak limiter being connected in parallel with the capacitive bridge and the first peak limiter being connected in parallel with the first capacitor.

4. The indicating system according to claim 1, further comprising for each phase a device for adjusting a presence threshold for the measured voltage connected in parallel with the visual indicator.

5. The indicating system according to claim 4, wherein the device comprises a set of switchable resistors connected in parallel with one another.

6. The indicating system according to claim 1, wherein the first peak limiter and the second peak limiter consist of two Zener diodes connected in opposite directions in series.

7. The indicating system according to claim 1, wherein it also includes for each phase a device for protection against transient voltage surges.

8. The indicating system according to claim 4, wherein the visual indicator includes an LED that is powered intermittently only when the measured voltage is greater than the presence threshold of the adjuster device.

9. A phase comparison system, comprising first and second voltage presence indicating systems according to claim 1, and a phase comparator, wherein the phase comparator is connected to the second output terminals of the first and second voltage presence indicating systems of a same phase of an electrical network, so as to detect a phase angle difference between the second output signals of the first and second voltage presence indicating systems.

* * * * *